US006404301B1

(12) United States Patent
Park et al.

(10) Patent No.: US 6,404,301 B1
(45) Date of Patent: Jun. 11, 2002

(54) METHOD OF FORMING NOISE FILTER FOR A MAGNETRON

(75) Inventors: Byeong Wook Park, Kwangmyoung; Kyung Ahn Kwon, Koyang; Joong Geon Rhee, Ahnsan, all of (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/565,454

(22) Filed: May 5, 2000

(30) Foreign Application Priority Data

Oct. 28, 1999 (KR) ............................................ 99-47141

(51) Int. Cl.[7] .................................................. H03H 7/01
(52) U.S. Cl. ..................................... 333/182; 315/39.51
(58) Field of Search ........................ 315/39.51; 333/182

(56) References Cited

U.S. PATENT DOCUMENTS 4,289,992 A * 9/1981 Kapitonova .............. 315/39.51
4,419,606 A 12/1983 Tsuzurabara et al. .... 315/39.51
5,432,405 A * 7/1995 Ochiai et al. ............ 315/39.51
5,604,405 A * 2/1997 Ogura ...................... 315/39.51
5,844,366 A * 12/1998 Ochiai ...................... 315/39.51
5,886,592 A * 3/1999 Fujiwara et al. ............ 333/182
6,204,601 B1 * 3/2001 Lidstrom et al. ........ 315/39.51

FOREIGN PATENT DOCUMENTS

EP 0554835 A1 2/1993 .............. 315/39.51

* cited by examiner

*Primary Examiner*—Justin P. Bettendorf
*Assistant Examiner*—Damian E. Cathey
(74) *Attorney, Agent, or Firm*—Birch, Stewart, Kolasch & Birch, LLP

(57) ABSTRACT

The present invention relates to a noise removing filter of a magnetron and a noise removing method. In the conventional art, the noise is removed by forming a low band pass filter formed of a choke coil and a through type capacitor. In this case, it is impossible to effectively remove the noises which are outputted at a band width below 100 MHz and at a band width of 500 MHz and 700-800 MHz. In order to overcome the above-described problem, a magnetron noise filter in accordance with the present invention which includes a shield box fixed to one side of the magnetron, a through type capacitor installed at one side of the shield box and a combined choke coil connected to a cathode terminal of the magnetron and a terminal of the capacitor, wherein the combined choke coil comprising a tightly wound portion around a bar having a certain diameter and a loosely wound portion connected with the tightly wound portion. Therefore, it is possible to remove noises which occur at a band width below 100 MHz and a high frequency band width above a few hundreds MHz.

2 Claims, 3 Drawing Sheets

METHOD OF FORMING NOISE FILTER FOR A MAGNETRON

BACKGROUND OF THE INVENTION

1. Field of the Invention

The present invention relates to a noise filter capable of removing noises generated due to a difference of a DC magnetic strength in an inner operation space of a magnetron and a collision with gases remaining in the inner operation space when electrons generated by a cathode rotate in the inner operation space, and in particular to a noise filter of a magnetron and a method for forming a noise filter which makes it possible to remove a noise generated at a high frequency band width higher than a few hundreds MHz by optimizing the length of a choke coil.

2. Description of the Background Art

Generally, in a magnetron, when a filament of a cathode terminal is heated by a power supplied thereto, and then thermal electrons are outputted, the thusly outputted thermal electrons circularly move by a magnetic field formed by a magnet installed in the inner space of the magnetron and an electrical field formed in a vertical direction with respect to the magnetic field, and radio frequency waves are outputted to the outside through a radio frequency output terminal.

When the magnetron is in an operation state, electrons which circularly move in an inner space of the magnetron colloid with the gases remaining in the operation space for thereby generating noises. At this time, the range of the noise is a few MHz to a few tens MHz. In order to remove the noises, a conventional magnetron noise filter, as shown in FIG. 1, is used.

As shown in FIG. 1, the conventional noise filter of the magnetron includes a shield box 10 fixed to a lower portion of the magnetron, a through type capacitor 20 installed by the shield box 10, a choke coil 40 for connecting a terminal of the through type capacitor 20 with a cathode terminal 30 of the magnetron, and a ferrite rod 50 installed in the choke coil 40 which will be explained in detail as follows.

The choke coil 40 is constructed that a first terminal unit 40-1 having a certain length is connected with the cathode terminal 30, a first bent portion 40-2 is extended and bent from the first terminal portion 40-1, a wound unit (choke coil 40-3) on which coils are wound many times for thereby having a certain diameter from the first bent portion 40-2, a second bent portion 40-4 is formed at an end of the wound portion 40-3, and a second terminal portion 40-5 is formed at an end of the second bent portion 40-4 and is connected with the terminal of the capacitor 20.

FIG. 2 illustrates an equivalent circuit of the magnetron noise filter of FIG. 1. As shown therein, there is provided an impedance $Z_L$ of the choke coil formed of an inductance component $L_L$ Of the choke coil 40, a resistance component $R_L$ which represents a power loss of the choke coil and a capacitance component $C_L$. In addition, the impedance $Z_L$ is connected with a ground through the through type capacitor 20 for thereby forming a low band pass filter.

FIG. 3 illustrates an attenuating ratio characteristic curve of the equivalent circuit of FIG. 2. As shown therein, resonant bands are generated between about 300 MHz and 1 GHz as indicated by the doted line circle.

The noise filter having the above-described characteristics will be analyzed based on the equivalent circuit of the noise filter of the conventional magnetron, as shown in FIG. 2.

In the case of the relatively low frequency wave, the noise filter is capable of removing noises because the resonant point can be detected. However, when the frequency is increased up to a frequency higher than a few hundreds MHz, the noise filter can not effectively remove noises because the resonant point can not be detected and it is impossible to predict where a resonant point is generated according to the frequency increase.

FIG. 4 illustrates an Electro-Magnetic Interference (EMI) characteristic curve of a product in which the conventional magnetron is adapted. As shown therein, noises which exceed an EMI radiating standard reference is generated below 100 MHz, around 500 MHz, and 700~800 MHz.

In order to overcome the problems of the above-described conventional noise filter, a coil is additionally provided to the choke coil of the magnetron for thereby forming a filter (not shown) having a two-tier coil structure in accordance with another conventional embodiment. Namely, in order to increase the noise attenuating capability of the noise filter in accordance with the first embodiment, the number of turns of the choke coil is increased for thereby increasing the impedance. In this case, the size of the choke coil is increased. A margin with respect to a safe distance is decreased due to a high Voltage. In this case, it is impossible to continuously increase the size of the choke coil for increasing the noise removing capability of the noise filter. Further, in order to increase the impedance, when the size of the choke coil is increased by increasing the number of turns of the choke coils, the temperature of the choke coil is increased for thereby causing temperature loss. Therefore, in order to satisfy the safe distance and a temperature increase condition and to remove for a radiation noise, an experiment must be performed for filtering noise with respect to all the magnetrons, respectively. Even when the above-described conditions are obtained based on the experiment, it is impossible to fabricate the magnetron noise filter which satisfies the above-described conditions. Therefore, a coil is additionally provided to the choke coil of the magnetron for thereby forming a 2-tier noise filter structure.

However, in the first embodiment of the conventional art, the noise filter formed of the choke coil and the through type capacitor has a problem that a noise generated below 100 MHz, near 500 MHz and at the band width of 700~800 MHz is not removed. In addition, in the two-tier noise filter, having an additional choke coil, in accordance with the second embodiment of the conventional art, it is impossible to perfectly remove the noise, and the price of the same is high.

SUMMARY OF THE INVENTION

Accordingly, it is an object of the present invention to provide a noise filter of a magnetron which is capable of removing noises generated at a high frequency bandwidth.

It is another object of the present invention to provided a method for forming a choke coil in a noise filter of a magnetron which is capable of removing noises generated at a high frequency bandwidth.

To achieve the above objects, there is provided a magnetron noise filter which includes a shield box fixed to one side of the magnetron, a through type capacitor installed at one side of the shield box and a combined choke coil connected to a cathode terminal of the magnetron and a terminal of the capacitor, wherein the combined choke coil comprising a tightly wound portion around a bar having a certain diameter and a loosely wound portion connected with the tightly wound portion.

To achieve the above objects, there is provided a method for forming a noise filter of a magnetron in which a filter including a cathode terminal of a magnetron, a through type capacitor and a choke coil is connected with the cathode terminal. The method includes a step of obtaining a certain resonant point at a high frequency band width, a step of setting a length of a physical copper line of a choke coil for enhancing an attenuating ratio of a resonant frequency with respect to the resonant point, a step of forming a tightly wound portion by winding a copper line having a set length onto a certain ferrite, a step of obtaining a resonant point with respect to the oscillation frequency reflected from the interior of the magnetron, and a step of setting the length of a physical copper line for thereby obtaining the resonant point and forming a loosely wound portion at a portion having a certain distance from the tightly wound portion.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

The construction and operation of a noise filter of a magnetron according to the present invention will be explained with reference to the accompanying drawings.

Figure 5:
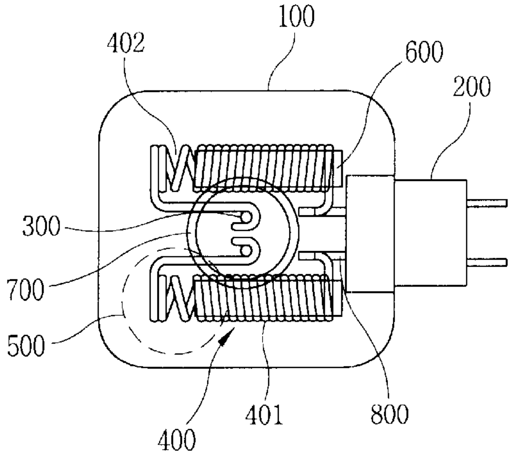
FIG. 5 is a view illustrating the construction of a noise filter of a magnetron according to the present invention.

FIG. 5 is a view illustrating the construction of a noise filter of a magnetron according to the present invention which includes a shield box 100 fixed to a lower portion of the magnetron, a through type capacitor 200 installed at one side of the shield box 100, and a combined type choke coil 400 for connecting terminals between the terminal 800 of the through type capacitor 200 with a cathode terminal 700 of the magnetron.

Here, the combined type choke coil 400 includes a tightly wound portion 401 having a plurality of closely contacting turn portions each having a certain diameter, and a loosely wound portion 402 connected with the tightly wound portion 401, which is formed at a certain distance from the tightly wound portion 401. In particular, the tightly wound portion 401 includes a ferrite 600 having a certain diameter therein. However, the loosely wound portion 402 does not include the ferrite 600 therein.

Accordingly, the noise filter of the magnetron constructed as the above mention is capable of effectively removing the noises generated at a high frequency. More specifically, the noise filter of the magnetron and the forming method of the same according to the present invention will be explained.

Figure 1:
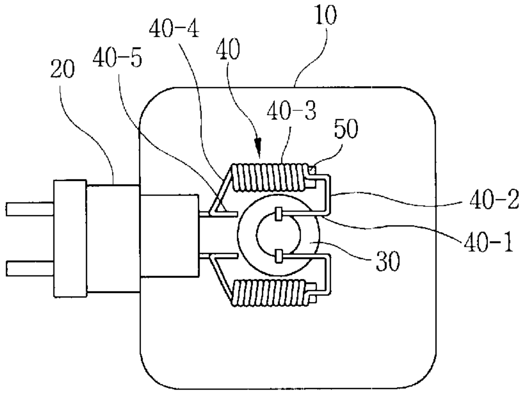
FIG. 1 CONVENTIONAL ART
FIG. 1 is a view illustrating a noise filter of a conventional magnetron.
Figure 2:
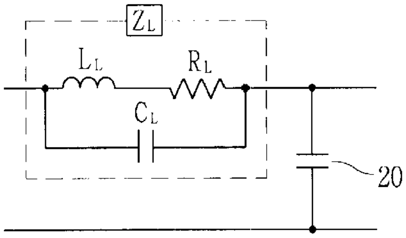
FIG. 2 CONVENTIONAL ART
FIG. 2 is a view illustrating an equivalent circuit of a noise filter of FIG. 1.
Figure 3:
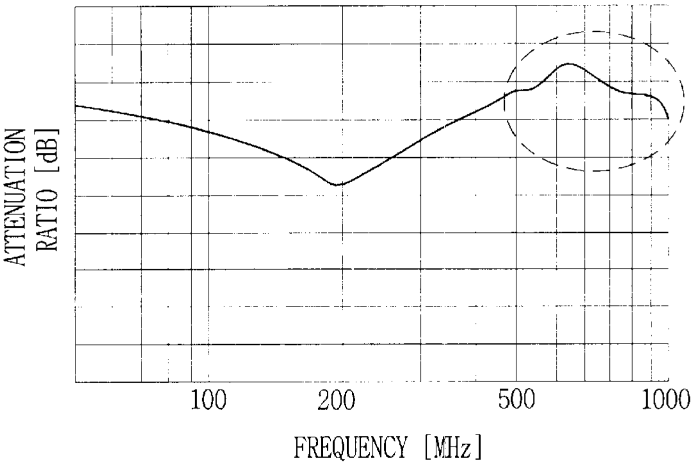
FIG. 3 CONVENTIONAL ART
FIG. 3 is a view illustrating an attenuating ratio characteristic curve of a choke coil of FIG. 1.
Figure 4:
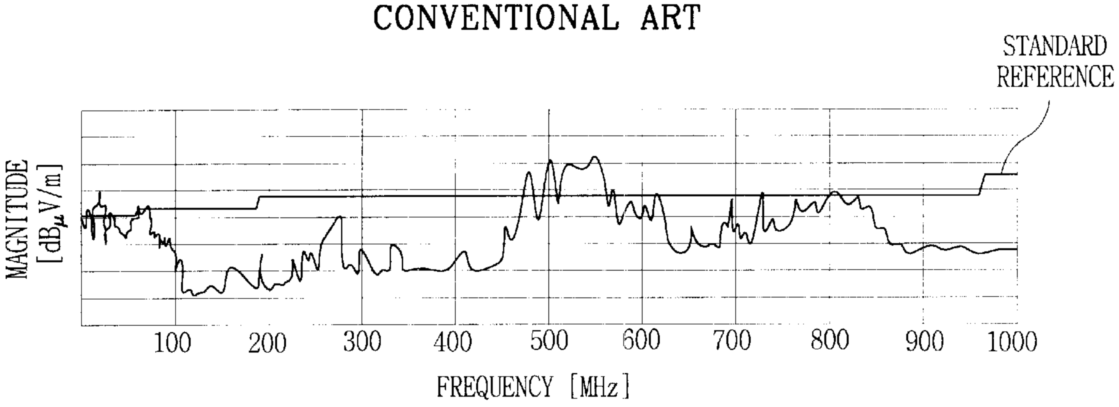
FIG. 4 CONVENTIONAL ART
FIG. 4 is a view illustrating a characteristic curve of an EMI noise which is generated in the conventional magnetron.

First, the method for forming a choke coil which is a major element of the noise filter will be explained. Namely, if the length of the copper line is smaller than the wave length of the electronic wave by comparing the length of the copper line of the choke line with the wave length of the electronic wave of the measured frequency, as shown in FIG. 2 or FIG. 7B, the frequency characteristic of the noise filter is analyzed based on the equivalent circuit of the conventional low band pass filter.

However, in the case that the length of the copper line of the choke coil is larger than the wave length of the electronic wave, since the phase of the signal propagated in the copper line is different, the frequency characteristic of the noise filter is not analyzed by the equivalent circuit of the conventional low band pass filter.

Figure 6:
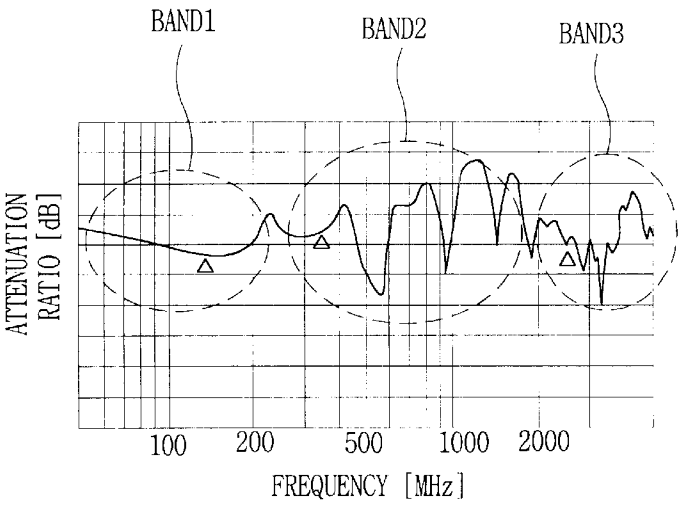
FIG. 6 is a view illustrating an attenuating ratio characteristic curve of a choke coil of the noise filter of a magnetron according to the present invention.
Figure 7A:
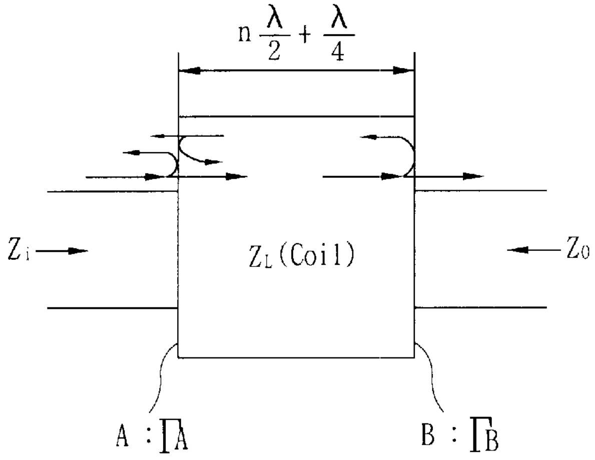
FIG. 7A is a view illustrating a transmission line model for analyzing the noise filter according to the present invention.
Figure 7B:
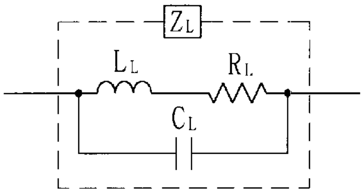
FIG. 7B is a view illustrating an equivalent circuit of a choke coil of the noise filter according to the present invention.

Therefore, in the case that the length of the copper line of the choke coil is larger than the wave length of the electronic wave, as shown in FIG. 7A, the choke coil of the noise filter is set based on the transmission line model, so that the noise filter is analyzed. Namely, the relatively lower frequency band width(the band 1 of FIG. 6) is analyzed based on the equivalent circuit of the conventional low band pass filter, and the relatively higher frequency band width(the bands 2 and 3 of FIG. 6) are analyzed based on the transmission line model, so that the frequency characteristic of the noise filter is analyzed in a range from the low frequency to a high frequency higher than a few GHz frequencies.

The frequency characteristic of the noise filter is analyzed in such a manner that the length of the copper line and the wavelength of the electronic wave are compared. As a result of the comparison, if the length of the copper line is up ¼ of the wavelength of the electronic wave, the noise filter is analyzed based on the transmission line model. The method that the noise filter is analyzed will be explained in detail.

In order to determine the length of the choke coil, the choke coil is connected with a network analyzer, and a signal having a certain frequency is inputted into the choke coil (to the side connected with the cathode terminal of the magnetron), and the inputted signal reaches at the surface A of the choke coil. At this time, since the impedance is different at the portions before and behind the choke coil based on the surface A, a part of the inputted signal is reflected from the surface A, and a part of the same is transmitted to the interior of the choke coil.

Since the signal inputted into the choke coil has different impedance before and behind the choke coil, on the surface B of the choke coil(to the side connected with the capacitor terminal), a part of the signal is reflected into the interior of the choke coil and is transmitted to the surface A, and a part of the same is transmitted through the surface B and is outputted to the terminal connected with the capacitor.

On the surface A, the signals transmitted through the surface A and the signals reflected from the surface B and coming back to the surface A are overlapped.

If the phases of the signal passed through the surface A and the signal reflected from the surface B are same, the amount of the reflection is greatly changed on the surface A. If the amount of the reflection is large, the smallest energy is transferred from the surface A to the surface B, so that the frequency attenuating ratio is increased.

Therefore, when forming the choke coil by measuring the length of the copper line which satisfies the above-described condition, it is possible to form a filter capable of removing the noise.

In detail, the reflection coefficients of the surfaces A and B having a change of the impedance may be expressed in the following Equations 1-1 and 1-2

$$\Gamma_A = \frac{Z_I - Z_L}{Z_I + Z_L} \tag{1-1}$$

$$\Gamma_B = \frac{Z_O - Z_L}{Z_O + Z_L} \tag{1-2}$$

$$\Gamma_B = -\Gamma_A = \Gamma_A e^{j\frac{\pi}{2}} \tag{1-3}$$

$$d = k\frac{V}{f} \tag{3}$$

where k represents a proportional constant, V represents a velocity coefficient, and f represents a resonant frequency.

Therefore, the physical length(d) of the choke coil is obtained by determining the unknown constants k×V based on the Equation (3).

In order to determine the unknown constants k×V, the phenomenon that the resonant point is moved toward the low frequency when increasing the length of the copper line is checked, and the interrelationship of the length of the copper line and the resonant frequency may be expressed as follows by adapting the second resonant point and the third resonant point obtained based on the Equation (3).

TABLE 1

| Number of turns [N] | Length of coil [cm] | Transmission line model: Second resonance: frequency [MHz] | log f | λ/4 [cm] | 0.49 λ/4 log f | Third resonance: Frequency [MHz] | log f | λ/4 [cm] | 0.49 λ/4 log f |
|---|---|---|---|---|---|---|---|---|---|
| 8 | 16 | — | — | — | — | 1610 | 3.21 | 14.0 | 16.18 |
| 10 | 20 | 510 | 2.70 | 14.7 | 19.45 | 1213 | 3.00 | 18.6 | 20.09 |
| 12 | 24 | 410 | 2.60 | 18.3 | 23.32 | 1042 | 3.01 | 21.6 | 23.41 |
| 14 | 28 | 330 | 2.51 | 22.7 | 27.92 | 832 | 2.90 | 27.0 | 28.19 |
| 16 | 32 | 287 | 2.45 | 26.1 | 31.33 | 710 | 2.80 | 31.8 | 32.05 |
| 18 | 36 | 227 | 2.35 | 33.0 | 38.00 | — | — | — | — |
| 20 | 40 | 189 | 2.27 | 39.7 | 44.16 | 675 | 2.83 | 33.3 | 33.93 |

where $\Gamma_A$ represents the reflection coefficient on the surface A, and $\Gamma_B$ represents the reflection coefficient on the surface B. In addition, $Z_L$ represents an impedance of the choke coil, and $Z_I$ represents an input impedance of the choke coil, and $Z_O$ represents an output impedance of the choke coil.

In particular, since $Z_I$ and $Z_O$ are same, the above-described Equation (1-3) is obtained. Namely, the Equation (1-3) represents that the sizes of the reflection coefficients on the surfaces A and B are same, and the phase has a 180 degree difference. Therefore, the phase of the signal proceeding from the surface A to the surface B is 180 degree. It means that the signal reflected from the surface B and combing to the surface A is proceeded by λ/2 than the signal proceeding from the surface A to the surface B.

The length of the copper line between the surfaces A and B has a difference of the λ/4 (or 90 degree phase difference) of the wave length of the inputted signal.

Therefore, the electrical length(I) of the transmission line is:

$$l = n\frac{\lambda}{2} + \frac{\lambda}{4},\ n = 0, \pm 1, \pm 2, \pm 3, \ldots \tag{2}$$

where n represents a resonant point, and λ represents a wave length of the inputted signal.

At this time, the Equation (2) represents a distance between two points in the case that the signal is transmitted in a free space, and the length(d) of a physical copper line may be expressed in the following Equation (3).

Therefore, the interrelationship of the actual length of the copper line(d) and the proportional constants k×V may be expressed based on the above-described table as follows.

$$\frac{3 \times 10^8\ [\text{m/s}]}{f\ [\text{Hz}]}.$$

Therefore, the length(d) of the copper line of the choke coil is obtained based on the Equation (4), and as shown in FIG. 5, the copper line is tightly wound on the ferrite 600 for thereby forming the tightly wound portion 400. At this time, when installing the tightly wound portion 400 in the shield box 100, the following two conditions must be satisfied.

First, the choke coil must have a stable distance more than a minimum 15.5 mm in the upper, lower, left and right portions in the shield box for thereby preventing a spark due to the discharge. Therefore, the diameter ψ of the ferrite 600 is 5.6~6.0 for thereby increasing the diameter of the tightly wound portion 400, so that it is possible to obtain a desired stable distance.

Second, the temperature loss problem must be overcome. Namely, the temperature loss problem occurs due to the temperature(1) conducted from the magnetron through the cathode terminal, the temperature(2) generated by the impedance of the choke coil, and the oscillation frequency component(3) (2.45 GHz) reflected in the interior of the magnetron.

In the above-described conditions(1) through (3), it is impossible to fully prevent the conditions (1) and (2) which occur due to an inherent reason of the magnetron. However, the condition(3) may be fully prevented. Namely, the resonant point with respect to the oscillation frequency 2.45 GHz(the band 3 of FIG. 6) which is a basic wave component of the basic magnetron which is reflected in the interior of the magnetron is obtained using the transmission line model according to the present invention. Thereafter, the length of the copper line is set by enhancing the attenuating ratio of the resonant frequency having the above-described resonant point.

As shown in FIG. 5, the length of the copper line is obtained by forming the loosely wound portion 500 having a certain diameter and a certain distance. The loosely wound portion has the same diameter as the diameter of the ferrite 600 included in the tightly wound portion.

Therefore, the noise filter of the magnetron is designed by forming the loosely wound portion 500, so that the temperature loss problem is overcome by reflecting the oscillation frequency component of the magnetron.

Therefore, in the noise filter of the magnetron according to the present invention, the EMI noises of more than a few hundreds MHz are removed by the tightly wound portion 400, and the noises of 2.45 GHz band width which is a basic oscillation frequency of the magnetron is obtained, and the length of the copper line is set for enhancing the attenuating ratio of the resonant frequency having the thusly obtained resonant point. Thereafter, a loosely wound portion having a certain distance is formed, and then the temperature loss problem is overcome, so that it is possible to obtain a desired wide band width characteristic.

Figure 8:
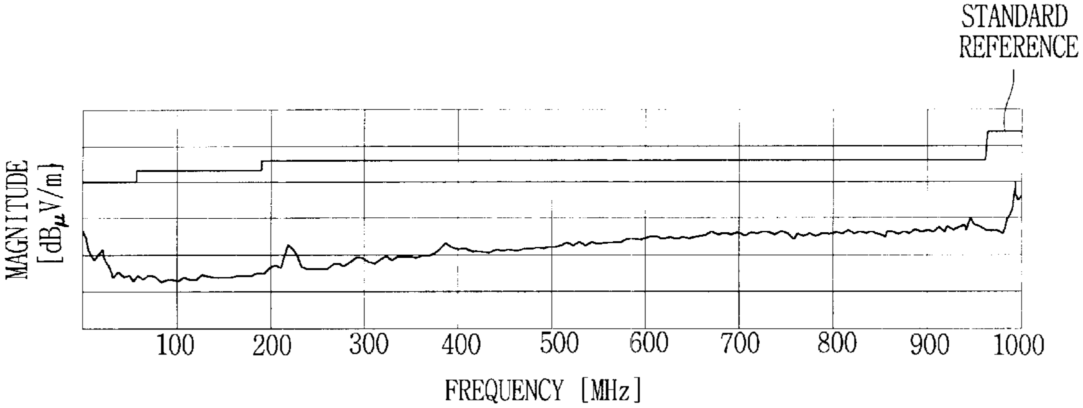
FIG. 8 is a view illustrating an EMI noise characteristic curve of the noise filter of a magnetron according to the present invention.

FIG. 8 is a view illustrating an EMI noise characteristic curve of the noise filter of a magnetron according to the present invention, as shown therein, the noises exceeding the EMI radiation reference standard are removed and not outputted from the magnetron at a low frequency bandwidth and a high frequency bandwidth.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method of forming a noise filter of a magnetron in which a filter including a cathode terminal of a magnetron, a through type capacitor and a choke coil is connected with the cathode terminal, the method comprising the steps of:

obtaining a first resonant point at a high frequency bandwidth implemented by using a transmission line model;

setting a length of a first portion of a copper line of the choke coil for enhancing an attenuating ratio of a resonant frequency with respect to the first resonant point;

forming a tightly wound portion of the choke coil by tightly winding the first portion of the copper line having the thusly set length onto a ferrite;

obtaining a second resonant point with respect to an oscillation frequency reflected from an interior of the magnetron; and setting the length of a second portion of the copper line for thereby obtaining the second resonant point and forming a loosely wound portion of the choke coil by loosely winding the second portion of the copper line having the thusly set length, spaced from the tightly wound portion.

2. The method of claim 1, wherein an interrelationship between the first and second resonant points and the length (d) of the first portion of the copper line is:

$$d_1=(0.49 \log f_1)\lambda_1 \text{ and } d_2=(0.36 \log f_2)\lambda_2$$

where, $d_1$ is the length of the first portion of the copper line at the first resonant point, $d_2$ is the length of the first portion of the copper line at the second resonant point, $$\lambda_1 = \frac{3\times 10^8\ (\text{m/s})}{f_1\ (\text{Hz})},\ \lambda_2 = \frac{3\times 10^8\ (\text{m/s})}{f_2\ (\text{Hz})},$$

$f_1$ is the first resonant point, and $f_2$ is the second resonant point.

* * * * *